(12) United States Patent
Michalski

(10) Patent No.: US 6,812,784 B2
(45) Date of Patent: Nov. 2, 2004

(54) AMPLIFIER COMMON-MODE FEEDBACK SYSTEMS FOR USE WITH SWITCHED-CAPACITOR STRUCTURES

(75) Inventor: Christopher Michalski, High Point, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/456,594

(22) Filed: Jun. 6, 2003

(65) Prior Publication Data

US 2004/0021511 A1 Feb. 5, 2004

(Under 37 CFR 1.47)

Related U.S. Application Data

(60) Provisional application No. 60/387,952, filed on Jun. 6, 2002.

(51) Int. Cl.[7] .............................. H03F 1/02; H03F 3/45; H03F 1/14
(52) U.S. Cl. ..................... 330/9; 330/258; 330/260; 330/51
(58) Field of Search ........................ 330/9, 258, 260, 330/51

(56) References Cited

U.S. PATENT DOCUMENTS

| | | | | |
|---|---|---|---|---|
| 3,982,196 A | * | 9/1976 | Poujois | 330/9 |
| 5,180,932 A | * | 1/1993 | Bengel | 327/362 |
| 5,414,311 A | | 5/1995 | Carley | 327/94 |
| 5,942,942 A | * | 8/1999 | Wang | 330/258 |
| 5,977,894 A | | 11/1999 | McCarroll et al. | 341/120 |
| 6,127,948 A | | 10/2000 | Hillis et al. | 341/155 |

* cited by examiner

*Primary Examiner*—Patricia Nguyen
(74) *Attorney, Agent, or Firm*—Kuppel, Jacobs, Patrick & Heybl

(57) ABSTRACT

Improved differential amplifiers are provided for use with switched-capacitor structures. Amplifier embodiments include a differential pair of high-transconductance transistors for generation of differential currents and routing of common-mode feedback signals along an independent path so that sufficient headroom is provided for other high-transconductance transistors that generate common-mode currents. The differential and common-mode currents preferably generate differential and common-mode output signals in finite output impedances of active loads.

27 Claims, 2 Drawing Sheets

AMPLIFIER COMMON-MODE FEEDBACK SYSTEMS FOR USE WITH SWITCHED-CAPACITOR STRUCTURES

CROSS REFERENCES TO RELATED APPLICATIONS

This application claims the benefit of U.S. Provisional Application Ser. No. 60/387,952 filed Jun. 6, 2002.

BACKGROUND OF THE INVENTION

1. Field of the Invention

The present invention relates generally to switched-capacitor systems and, more particularly, to differential amplifiers in such systems.

2. Description of the Related Art

FIG. 1 illustrates a switched-capacitor system 20 in which a sample capacitor $C_s$ has a top plate 21 coupled to the inverting input of a differential amplifier 22 and a bottom plate 23 coupled through an input sample switch 24 to an input port 25. The differential amplifier 22 drives an output port 26 and a transfer capacitor $C_t$ is coupled across the differential amplifier. The differential amplifier has a high gain so that its non-inverting input has substantially the same potential as its inverting input. Finally, a second sample switch 27 and a transfer switch 28 are respectively coupled to the top and bottom plates 21 and 23.

In an operational sample mode, the input and second sample switches 24 and 27 are closed so that an analog input signal $S_{in}$ at the input port 25 urges a sample charge $Q_s$ into the sample capacitor $C_s$ to thereby acquire a sample signal $S_s = Q_s/C_s$ across the sample capacitor. In an operational transfer mode, the first and second sample switches 24 and 27 are opened and the transfer switch 28 is closed to transfer the sample charge $Q_s$ into the transfer capacitor $C_t$ and thus generate an output signal $S_{out} = Q_s/C_t$ at the output port 26.

The switched-capacitor system 20 of FIG. 1 is thus formed with the differential amplifier 22 and a switched-capacitor structure 29 that includes the sample and transfer capacitors $C_s$ and $C_t$. The switched-capacitor structure 29 acquires a sample signal $S_s$ in a sample mode and the differential amplifier processes the sample signal $S_s$ into the output signal $S_{out}$ across the output capacitor during the transfer mode. A transfer function of $C_s/C_t$ is thus realized and this transfer function is represented in the graph 30 of FIG. 2 by a plot 32 which has a slope of $C_s/C_t$.

The switched-capacitor system 20 (and differential versions thereof) is especially suited for use as a sampler in a variety of signal conditioning systems (e.g., pipelined analog-to-digital converters (ADCs)). In such systems, the switches of the system 20 of FIG. 1 are typically realized with complementary metal-oxide-semiconductor (CMOS) transistors. This realization is exemplified in FIG. 1 by a CMOS transistor 34 that is substituted for the input sample switch 24 as indicated by the substitution arrow 35.

In pipelined ADCs, an initial ADC stage (e.g., a flash ADC) typically converts an analog input signal into at least one most-significant bit Do of a digital output signal that corresponds to the input signal $S_{in}$. At the same time, the sampled signal is processed into a residue signal $S_{res}$ that is suitable for subsequent processing by downstream ADC stages into the less-significant bits of the output digital signal.

If the initial ADC stage is a 1.5 bit converter stage, for example, it provides a residue signal $S_{res}$ that corresponds to the plot 36 in FIG. 2 which has two steps 37 that are equally spaced from the midpoint of the range of the input signal $S_{in}$. The steps are initiated by decision signals from the initial ADC stage. The plot 36 of the residue signal $S_{res}$, therefore, has three segments defined by the steps 37 and each segment has a slope that is twice the slope of the plot 32.

The residue signal illustrated by the plot 36 can be generated, for example, by supplementing the sample capacitor $C_s$ of FIG. 1 with an additional sample capacitor to realize the increased slope (i.e., increased gain) and by replacing the transfer switch 28 with a multipole transfer switch 38 as indicated by the substitution arrow 39. The transfer switch responds to digital decision signals $S_{dgtl}$ from the initial ADC stage by applying selected offset signals (e.g., +V and −V) to the bottom plate of at least one of the sample capacitors and the offset signals generate the steps 37 in the plot 32 of FIG. 2. When the switched-capacitor system 20 of FIG. 1 is modified in this fashion, it is typically referred to as a multiplying digital-to-analog converter (MDAC).

The speed and accuracy of the sample and transfer modes of the switched-capacitor system 20 are strongly dependent upon the processing performance of the differential amplifier 22. Because the system 20 operates in sample and transfer modes, the differential amplifier must function in a demanding noncontinuous operation which often compromises its performance.

BRIEF SUMMARY OF THE INVENTION

The present invention is directed to improved differential amplifiers for use with switched-capacitor structures. Amplifier embodiments of the invention include a differential pair of high-transconductance transistors for generation of differential currents and route common-mode feedback signals along an independent path so that sufficient headroom is provided for other high-transconductance transistors that generate common-mode currents. The differential and common-mode currents preferably generate differential and common-mode output signals in finite output impedances of active loads.

The novel features of the invention are set forth with particularity in the appended claims. The invention will be best understood from the following description when read in conjunction with the accompanying drawings.

DETAILED DESCRIPTION OF THE INVENTION

Figure 2:
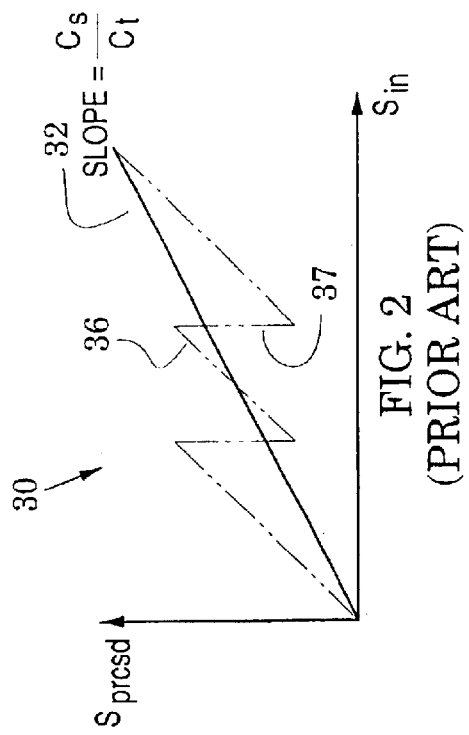
FIG. 2 is a graph which shows transfer functions in the switched-capacitor systems of FIG. 1.
Figure 1:
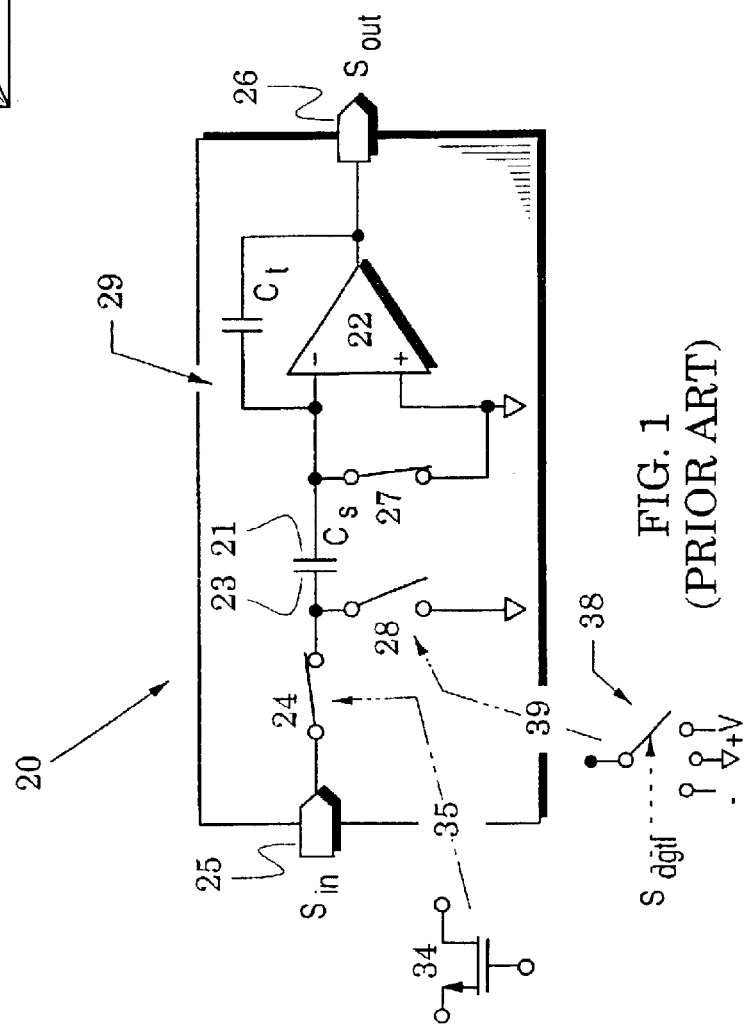
FIG. 1 is a schematic of exemplary switched-capacitor systems.
Figure 3:
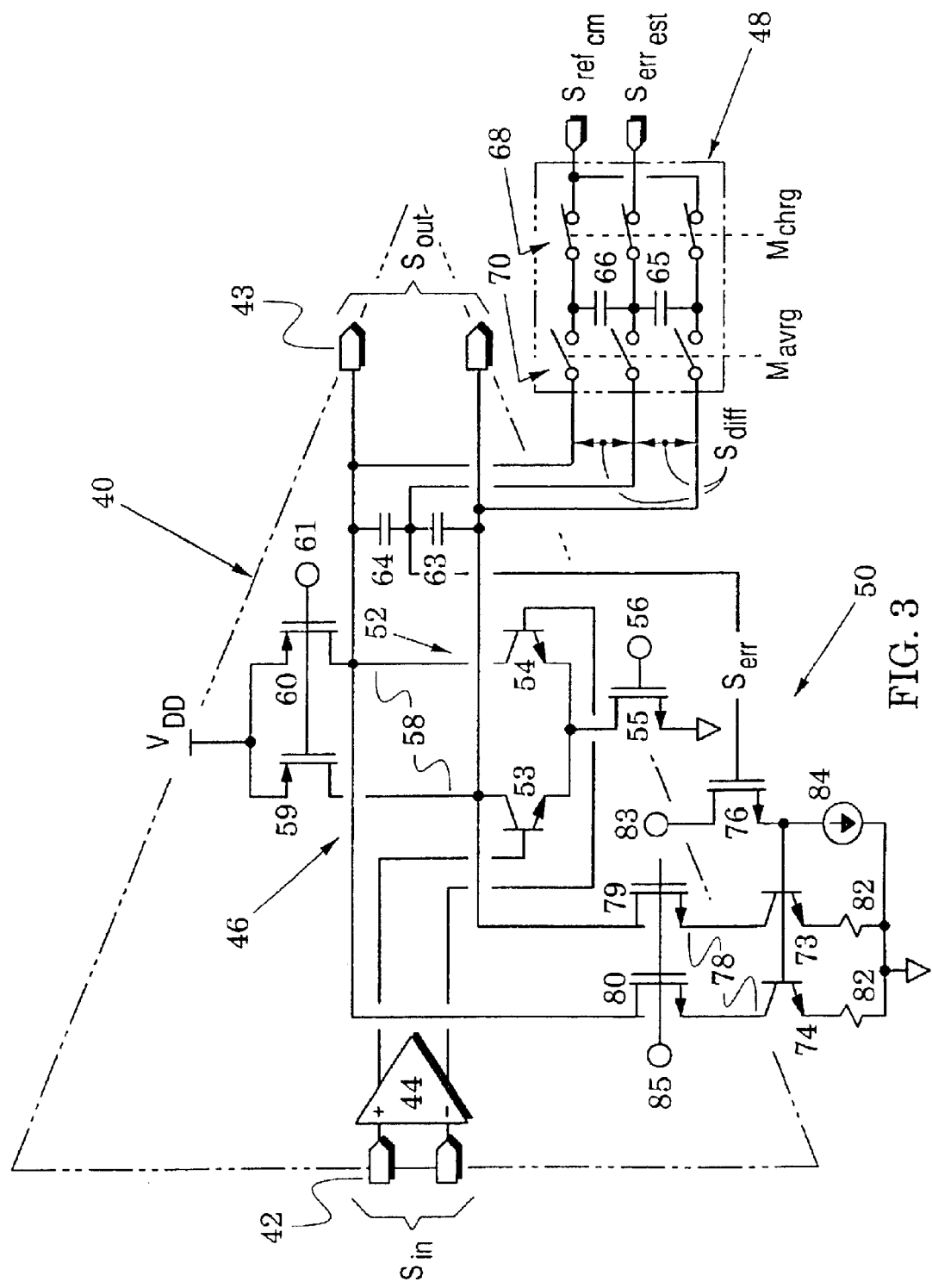
FIG. 3 is a schematic diagram of a differential amplifier embodiment of the present invention for use in the switched-capacitor systems of FIG. 1.

FIG. 3 illustrates a switched-capacitor amplifier 40 which provides a differential output signal $S_{out}$ at a differential output port 43 in response to a differential input signal $S_{in}$ at a differential input port 42 and corrects a common-mode level of the output signal $S_{out}$ in accordance with a common-mode reference signal $S_{ref_{cm}}$ and an estimated error signal $S_{err_{est}}$ which are both shown below the output port 43. The amplifier 40 includes a differential preamplifier 44, a differential postamplifier 46, a switched-capacitor network 48 and a common-mode feedback loop 50 that are arranged between exemplary references of $V_{DD}$ and ground.

Because the invention's amplifier 40 is intended for operation in a switched-capacitor environment (e.g., switched-capacitor samplers and MDACs), it must substantially operate with a 50% duty cycle and, therefore, requires the common-mode memory provided by its own switched-capacitor network 48. Each time the amplifier transitions from a system sample mode to a system transfer mode, however, it must settle to the common-mode value stored in the switched-capacitor network 48.

The invention recognizes that this network loads the amplifier's output with a substantial dominant-pole capacitance $C_d$ and that the speed and accuracy of the transition operation is dependent on the gain-bandwidth product (GBW) of the amplifier's feedforward and feedback portions and that GBW is substantially proportional to a $g_m/C_d$ ratio in which $g_m$ is transconductance—the ratio of output current to input voltage.

In order to improve the amplifier's transition speed, the invention further recognizes that the transconductance $g_m$ must be enhanced in its differential feedforward portion and also in its common-mode feedback portion. Realizing that the transconductance $g_m$ of bipolar junction transistors is proportional to their collector currents whereas the transconductance gm of CMOS transistors is proportional to the square root of their drain currents, the invention desires therefore to generate both differential and common-mode currents with bipolar junction transistors.

It is further recognized, however, that photolithographic techniques for the fabrication of modern signal conditioning systems are directed to the realization of greater circuit densities by the use of thinner line widths and these thinner lines require a reduction of headroom, i.e., reduction of an integrated circuit's supply voltage ($V_{DD}$ in FIG. 3). The invention therefore routes its common-mode feedback along an independent path so that sufficient headroom is provided for inclusion of bipolar junction transistors in both the differential postamplifier 46 and the common-mode feedback loop 50 for respective generation of differential and common-mode currents.

Directing attention now to amplifier details, the amplifier 40 is provided with a high-gain, wide-bandwidth preamplifier 44 that is preferably realized with high input-impedance devices (e.g., complementary metal-oxide-semiconductor (CMOS) devices) to thereby reduce input currents that would otherwise degrade the accuracy of the switched-capacitor environment of the amplifier 40.

The postamplifier 46 includes a differential pair 52 of bipolar junction transistors 53 and 54 that steer current from a current source 55 (which responds to a gate bias 56) through first collectors 58 that are provided with active loads in the form of current source transistors 59 and 60 that respond to a gate bias 61. The differential pair 52 is driven by the output of the preamplifier 44 and its collectors 58 are coupled to the output port 43.

The switched-capacitor network 48 includes first and second capacitors 63 and 64 that are serially-coupled across the first collectors 58. It also includes third and fourth serially-coupled capacitors 65 and 66 which are coupled to the common-mode reference signal $S_{ref_{cm}}$ and the estimated error signal $S_{err_{est}}$ by a first switch network 68 that conducts signals in an operational charging mode $M_{chrg}$. When conducting, the first switch network 68 couples the outer plates of the third and fourth capacitors 65 and 66 to the common-mode reference signal $S_{ref_{cm}}$ and couples the joined inner plates of the third and fourth capacitors to the estimated error signal $S_{err_{est}}$.

A second switch network 70 conducts signals in an operational averaging mode $M_{avrg}$. When conducting, the second switch network 70 couples the outer plates of the third and fourth capacitors 65 and 66 to respective outer plates of the first and second capacitors 63 and 64 and couples the joined inner plates of the third and fourth capacitors to the joined inner plates of the first and second capacitors.

Accordingly, a difference signal $S_{diff}$ is stored across the third and fourth capacitors 65 and 66 in the charging mode $M_{chrg}$ and this difference signal equals the difference between the common-mode reference signal $S_{ref_{cm}}$ and the estimated error signal $S_{err_{est}}$. During the averaging mode averaging mode $M_{avrg}$, the stored difference signal $S_{diff}$ is coupled across the first and second capacitors 63 and 64 to generate an error signal $S_{err}$ at the joined inner plates of the first and second capacitors 63 and 64.

The common-mode feedback loop 50 includes first and second bipolar junction feedback transistors 73 and 74 that respond through an error buffer 76 to the error signal $S_{err}$. The first and second feedback transistors have second collectors 78 that are each coupled through a respective one of feedback buffers 79 and 80 to a respective one of the first collectors 58. Preferably, the feedback transistors have emitter resistors 82, the error buffer 76 is a common-source stage coupled between a bias 83 and a current source 84 and the feedback buffers 79 and 80 are common-gate stages coupled to a bias 85.

In operation of the amplifier 40, the input signal $S_{in}$ at the input port 42 is amplified by the preamplifier 44 and subsequently amplified by the postamplifier 46 to thereby generate the output signal $S_{out}$ at the output port 43. To prevent degradation of the accuracy of the output signal $S_{out}$, it is crucial that the common-mode signal level of the first collectors 58 (of the differential pair 52) be controlled. In particular, the common-mode signal level should be maintained substantially equal to the common-mode reference signal $S_{ref_{cm}}$ which may be generated, for example, by an associated bias network (not shown).

The amplifier 40, however, is configured for operation in a switched-capacitor environment so that the amplifier is active during a system transfer mode and turned off (e.g., by shorting the first collectors 58) during a system sample mode. The switched-capacitor network 48 with its first and second capacitors 63 and 64 is therefore provided to control the common-mode level of the first collectors 58 during the operation of the postamplifier 46. To this end, the switched-capacitor network 48 generates (via the first and second capacitors 63 and 64) the error signal $S_{err}$ which is coupled to the first and second feedback transistors 73 and 74 by the feedback buffer 76.

It is noted that the error signal $S_{err}$ will be spaced from the ground reference by a gate-to-source voltage $V_{gs}$ (due to the buffer 76), a base-to-emitter voltage $V_{be}$ (due to the transistors 73 and 74) and an associated voltage drop across the resistors 82. It is desirable that the estimated error signal $S_{err_{est}}$ (that is associated with the switched-capacitor network 48) be a close approximation of the final error signal $S_{err}$ that is developed by the common-mode feedback loop 50. Therefore, the estimated error signal $S_{err_{est}}$ is preferably generated by a mimicking network (not shown) that mimics the feedback buffer 76, at least one of the feedback transistors 73 and 74 and at least one of the resistors 82.

In operation of the amplifier 40 during the charging mode $M_{chrg}$, the first switch network 68 couples the common-mode reference signal $S_{ref_{cm}}$ to the outer plates of the first and second capacitors 65 and 66 and couples the estimated error signal $S_{err_{est}}$ to their joined inner plates. Thus, the difference signal $S_{diff}$ is established across each of these capacitors as indicated in FIG. 3. Typically, the amplifier 40 will be active during the charging mode $M_{chrg}$ which generally corresponds to the transfer mode of the amplifier's switched-capacitor environment.

During the averaging mode $M_{avrg}$, the difference signals $S_{diff}$ are coupled across the first and second capacitors 63 and 64 by the second switch network 70. The difference signal $S_{diff}$ is thus averaged with the signal that was previously stored in the first and second capacitors 63 and 64 and, as a result, a revised error signal $S_{err}$ is coupled through the buffer 76 to the feedback transistors 73 and 74.

In response, the currents in the second collectors 78 are altered and, because the currents in the second collectors 78 are drawn from the finite output impedances of the current sources 59 and 60 (as are the differential currents of the first collectors 58), the existing common-mode voltage is also altered. Typically, the amplifier 40 will be off during the averaging mode $M_{avrg}$ which generally corresponds to the sample mode of the amplifier's switched-capacitor environment.

At successive averaging modes $M_{avrg}$, the difference signal $S_{diff}$ is successively averaged with existing signals on the first and second capacitors 63 and 64 so that the signal across these capacitors converges towards the difference signal $S_{diff}$ and the common-mode level at the first collectors 58 converges towards the common-mode reference signal $S_{ref_{cm}}$.

In accordance with the invention, therefore, the common-mode feedback is routed along an independent path so that sufficient headroom is provided for inclusion of bipolar junction transistors in both the differential postamplifier 46 and the common-mode feedback loop 50 of FIG. 3. The high transconductance of these transistors realizes differential and common-mode currents that enhance the speed and accuracy of transitions between the sample and transfer modes of the amplifier's switched-capacitor environment.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An amplifier that provides an output signal in response to an input signal, comprising:
    a differential pair of transistors that respond to said input signal and that have first collectors which provide said output signal;
    first and second capacitors serially coupled across said first collectors to provide an error signal $S_{err}$; and
    first and second feedback transistors that respond to said error signal $S_{err}$ and have second collectors that are each coupled to a respective one of said first collectors.

2. The amplifier of claim 1, further including an error buffer inserted to couple said error signal $S_{err}$ to said first and second feedback transistors.

3. The amplifier of claim 2, wherein said error buffer is a common-drain amplifier stage.

4. The amplifier of claim 1, further including first and second feedback buffers that are each inserted between a respective one of said first collectors and a respective one of said second collectors.

5. The amplifier of claim 4, wherein said feedback buffers are common-gate amplifier stages.

6. The amplifier of claim 1, further including first and second active loads that are each coupled to a respective one of said first collectors.

7. The amplifier of claim 1, further including a preamplifier inserted to receive said input signal and wherein said differential pair responds to said preamplifier.

8. The amplifier of claim 1, further including a switched-capacitor network that, in a first operational mode, generates a difference signal $S_{diff}$ that represents the difference between a common-mode reference signal $S_{ref_{cm}}$ and an estimated error signal $S_{err_{est}}$ and, in a second operational mode, couples said difference signal $S_{diff}$ across said first and second capacitors.

9. The amplifier of claim 8, wherein said switched-capacitor network includes:
    serially-coupled third and fourth capacitors;
    a first switch network that, in said first operational mode, couples said third and fourth capacitors to said difference signal $S_{diff}$; and
    a second switch network that, in said second operational mode, respectively couples said third and fourth capacitors in parallel with said first and second capacitors.

10. A switched-capacitor amplifier that provides an output signal in response to an input signal and corrects a common-mode level of said output signal in accordance with a common-mode reference signal $S_{ref_{cm}}$ and an estimated error signal $S_{err_{est}}$, the amplifier comprising:
    a differential pair of transistors that respond to said input signal and that have first collectors which provide said output signal;
    first and second active loads that are each coupled to a respective one of said first collectors;
    first and second capacitors serially coupled across said first collectors to provide an error signal $S_{err}$;
    a switched-capacitor network that, in a first operational mode, generates a difference signal $S_{diff}$ that represents the difference between said common-mode reference signal $S_{ref_{cm}}$ and said estimated error signal $S_{err_{est}}$ and, in a second operational mode, couples said difference signal $S_{diff}$ across said first and second capacitors; and
    first and second feedback transistors that respond to said error signal $S_{err}$ and have second collectors that are each coupled to a respective one of said first collectors.

11. The amplifier of claim 10, wherein said switched-capacitor network includes:
    serially-coupled third and fourth capacitors;
    a first switch network that, in said first operational mode, couples said third and fourth capacitors to said difference signal $S_{diff}$; and
    a second switch network that, in said second operational mode, respectively couples said third and fourth capacitors in parallel with said first and second capacitors.

12. The amplifier of claim 10, further including an error buffer inserted to couple said error signal $S_{err}$ to said first and second feedback transistors.

13. The amplifier of claim 12, wherein said error buffer is a common-drain amplifier stage.

14. The amplifier of claim 10, further including first and second feedback buffers that are each inserted between a respective one of said first collectors and a respective one of said second collectors.

15. The amplifier of claim 14, wherein said feedback buffers are common-gate amplifier stages.

16. The amplifier of claim 10, further including a preamplifier inserted to receive said input signal and wherein said differential pair responds to said preamplifier.

17. A switched-capacitor system that samples an analog input signal in a sample mode and provides a corresponding output signal in a transfer mode, the system comprising:

a switched-capacitor structure that includes an output capacitor and that acquires a sample signal in said sample mode;

a differential amplifier coupled across said output capacitor to process said sample signal into said output signal during said transfer mode wherein said differential amplifier includes:

a) a differential pair of transistors that respond to said sample signal and that have first collectors which provide said output signal;

b) first and second capacitors serially coupled across said first collectors to provide an error signal $S_{err}$; and c) first and second feedback transistors that respond to said error signal $S_{err}$ and have second collectors that are each coupled to a respective one of said first collectors.

18. The system of claim 17, further including an error buffer inserted to couple said error signal $S_{err}$ to said first and second feedback transistors.

19. The system of claim 18, wherein said error buffer is a common-drain amplifier stage.

20. The system of claim 17, further including first and second feedback buffers that are each inserted between a respective one of said first collectors and a respective one of said second collectors.

21. The system of claim 20, wherein said feedback buffers are common-gate amplifier stages.

22. The system of claim 17, further including first and second active loads that are each coupled to a respective one of said first collectors.

23. The system of claim 17, further including a preamplifier inserted to receive said input signal and wherein said differential pair responds to said preamplifier.

24. The system of claim 17, further including a switched-capacitor network that, in said transfer mode, generates a difference signal $S_{diff}$ that represents the difference between a common-mode reference signal $S_{ref_{cm}}$ and an estimated error signal $S_{err_{est}}$ and, in said sample mode, couples said difference signal $S_{diff}$ across said first and second capacitors.

25. The system of claim 24, wherein said switched-capacitor network includes:

serially-coupled third and fourth capacitors;

a first switch network that, in said transfer mode, couples said third and fourth capacitors to said difference signal $S_{diff}$, and a second switch network that, in said second sample mode, respectively couples said third and fourth capacitors in parallel with said first and second capacitors.

26. The system of claim 25, wherein said switched-capacitor structure further includes:

first and second sample switches that close during said sample mode;

a sample capacitor coupled between said first and second sample switches; and a transfer switch which closes during said transfer mode and which is coupled in series with said sample and transfer capacitors.

27. The system of claim 26, wherein said transfer switch is arranged to apply selected offset signals to said sample capacitor.

* * * * *